US006816167B1

United States Patent
Rauchfuss et al.

(10) Patent No.: US 6,816,167 B1
(45) Date of Patent: Nov. 9, 2004

(54) ANISOTROPIC FILTERING TECHNIQUE

(75) Inventors: Brian D. Rauchfuss, Rancho Cordova, CA (US); Val Cook, Shingle Springs, CA (US); Tom Piazza, Granite, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/480,622

(22) Filed: Jan. 10, 2000

(51) Int. Cl.[7] .................................................. G09G 5/00
(52) U.S. Cl. ...................................... 345/582; 345/613
(58) Field of Search ................................ 345/582, 587, 345/609, 613

(56) References Cited

U.S. PATENT DOCUMENTS

| 5,651,104 | A | * | 7/1997 | Cosman ...................... 395/128 |
| 6,184,893 | B1 | * | 2/2001 | Devic et al. ................. 345/430 |
| 6,304,268 | B1 | * | 10/2001 | Iourcha et al. .............. 345/428 |
| 6,317,525 | B1 | * | 11/2001 | Aleksic et al. .............. 382/299 |
| 6,369,828 | B1 | * | 4/2002 | Lewis ......................... 345/611 |
| 6,501,483 | B1 | * | 12/2002 | Wong et al. ................. 345/611 |

* cited by examiner

Primary Examiner—Mark Zimmerman
Assistant Examiner—Scott Wallace
(74) Attorney, Agent, or Firm—Schwegman, Lundberg, Woessner & Kluth, P.A.

(57) ABSTRACT

An anisotropic filtering technique includes defining pixel elements in two dimensions and defining at least one object having three dimensional surfaces in a three-dimensional model space and storing texel elements in two dimensions defining a texture map bearing a relationship to the three dimensional surfaces of the at least one object. Each pixel element to be texture mapped is divided into a group of sub-pixel elements and the sub-pixel elements are separately texture mapped. The resultant textures of the sub-pixel elements are averaged to obtain a texture for their respective pixel element.

26 Claims, 7 Drawing Sheets

ANISOTROPIC FILTERING TECHNIQUE

FIELD

The present invention relates to three-dimensional computer graphics systems and more specifically to an anisotropic filtering technique which employs super-sampling of two-dimensional data that is structured with multiple levels of detail for producing high quality anti-aliased texture mapped objects in a model space.

BACKGROUND

Computer graphics systems present dynamic images by displaying data on the screen of a cathode ray tube (CRT). The CRT screen displays an array consisting of thousands of individual picture elements (pixels).

In traditional three-dimensional graphics systems, the three-dimensional images are represented on the two-dimensional CRT screen. The representation is effected by defining a three-dimensional model space and assigning sections of the model space to the pixels of the CRT screen. Each pixel displays the combined visual effects such as color, shading, and transparency of the three-dimensional model space that is contained within its viewing frustum, as described below.

The surfaces of the objects within a three-dimensional model space are generally defined by or reduced to a collection of three-dimensional polygons. Each polygon may be assigned attributes such as intensity, color and opacity, which affect the resulting pixels to be displayed on the CRT screen. These attributes are generally specified at the vertices of the polygons. The process of rendering constitutes determining the pixel frustum, a pyramidal volume of space, as defined by a viewer location at the apex of a pyramid and the infinite projection for four rays passing through extents of a pixel. In so far as a polygon lies within the defined frustum for a specified pixel, the attributes of at least one sample point are determined, commonly using various forms of interpolation from the specified attribute values at the vertices. The surface of objects, in a three-dimensional modeling space, are frequently divided into very many small polygons in order to assign vertex attributes with sufficient resolution to communicate the desired detail to a viewer. This is generally considered an inefficient approach to adding detailed visual characteristics to an object.

The visual characteristics of a polygon may be enhanced by "texturing mapping" polygons, which are generally much larger than would be required using the previous approach. This process is comparable to applying contact paper to the surface of a three-dimensional object and is a well-known and widely used technique in computer graphics. The texture is represented by a two-dimensional array of data, each data element in the array is called a texel and the array is called a texture map. The texture map can represent intensity, color, opacity and many other spatially varying properties. The two coordinate axes of the texture coordinate space are defined by rows of columns of the array and are typically designated by U and V coordinates. A polygon is associated with a specific region of a texture map by relating the vertices of the polygon with individual U, V locations in a texture map. The texels, which lie within the area of the texture map circumscribed by the polygon, are sampled to produce pixels for display on a CRT screen.

It its simplest form, sampling the texels of the texture map constitutes performing a table look-up, commonly called "point sampling," of the texels at a specified U, V location. However, this approach results in undesirable visual artifacts, which are commonly classified as "aliasing." Aliasing is a term used in the industry for a wide variety of image quality problems including image crawling, edge staircasing, moire patterns, scintillation, and other image noise. Aliasing generally results from sampling a signal at a lower frequency than twice the highest frequency in the original signal. With respect to texture mapping, if the frequency or the discrete texels contained within the pixel frustum exceeds the threshold sampling frequency, aliasing will result.

One solution to the aliasing problem involves sampling the entire area of the projection of the pixel frustum onto a texture map and combining the individual samples to produce a single aggregated pixel. The projection of a pixel onto a polygon, which is oriented at an oblique angle with respect to the viewer's location, can result in an arbitrarily large area. The time necessary to sample this area, termed the projected pixel footprint or simply pixel footprint here after, is also arbitrarily large. This approach is therefore considered computationally intractable.

To reduce this processing a technique, known as "mip mapping," which uses a sequence of pre-filtered texture maps at various levels of detail (LOD) is commonly employed. Mip maps are representations of a single image at multiple resolutions. Each texture map beyond the initial LOD is a filtered version of a more detailed texture map, usually the highest resolution texture map. Each successive LOD is often one-half as wide and one-half as high as the previous LOD. A determination is made as to which LOD to sample, and is based on the relative size of the projected pixel footprint with respect to the size of the pixel. Intuitively, the LOD is chosen so that the texels are not smaller than the pixel. This approach results in anti-aliased images which are computationally tractable. However, the box-filtered nature of the pre-filtered texture maps assumes a one-to-one aspect ratio of the pixel footprint. When this requirement is not met, the LOD is generally chosen such that the major axis of the pixel footprint dominates the selection computation. The resulting visual effect is that the image appears excessively blurred.

U.S. Pat. No. 5,651,104 to Cosman, entitled "Computer Graphics System And Process For Adaptive Super Sampling" describes a technique for the anisotropic, non-uniform direction based, filtering of a texture map which more accurately samples the projected pixel footprint and provides a higher image quality than the aforementioned techniques.

While the arrangement of Cosman is an improvement over earlier systems, it still has many disadvantages that will be discussed below.

BRIEF DESCRIPTION OF THE DRAWING(S)

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein.

DETAILED DESCRIPTION

Although example embodiments of the present invention will be described using an example system block diagram in an example personal computer (PC) environment, practice of the invention is not limited thereto, i.e., the invention may be practiced with other types of systems, and in other types of environments (e.g., servers).

Figure 1:
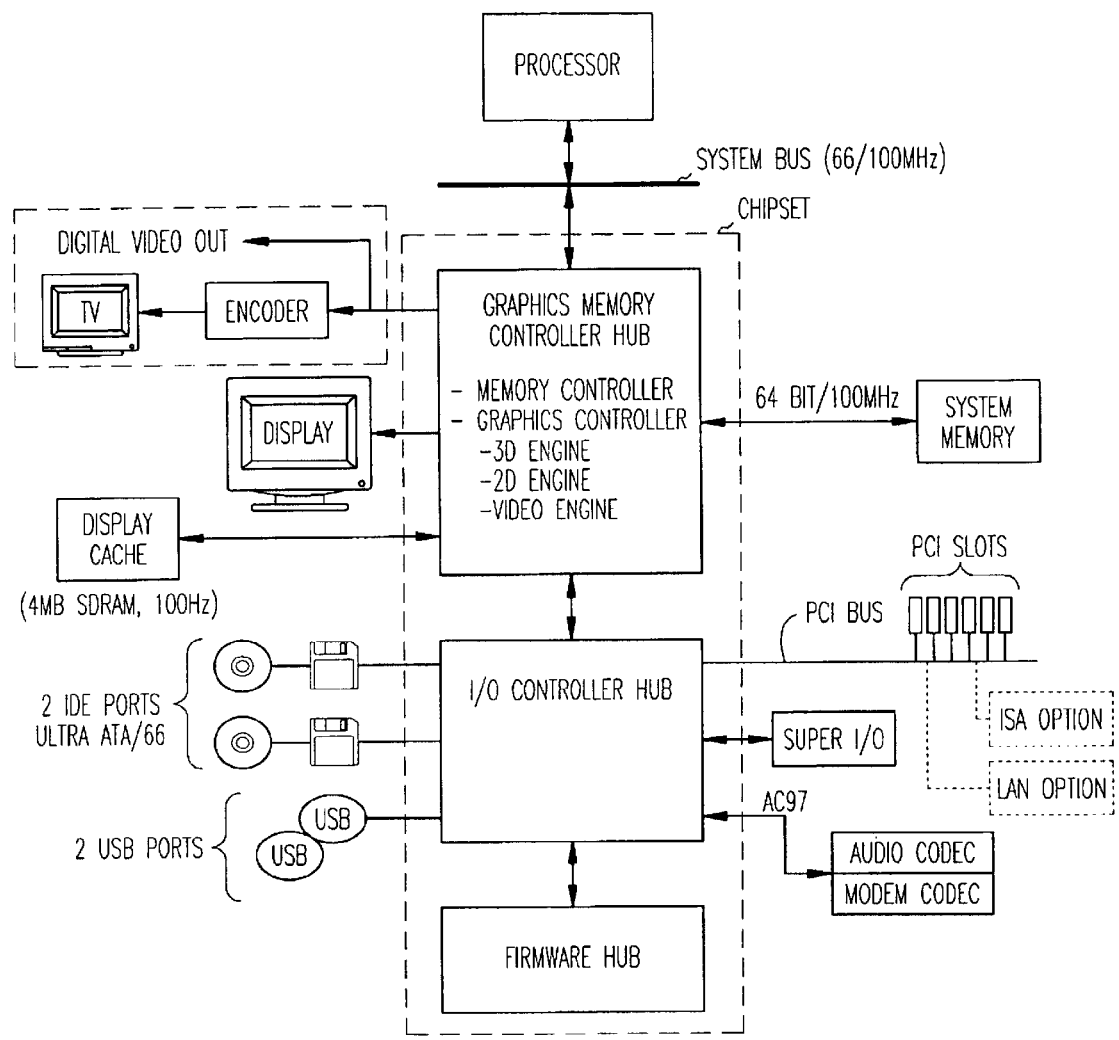
FIG. 1 is an example system block diagram of a personal computer environment.

Turning now to more detailed description, FIG. 1 is an example system block diagram in an example personal computer (PC) environment. Included within such system may be a processor (e.g., an Intel® Celeron® processor) connected to a system bus and the system bus may in turn be connected to a chipset (enclosed is a dashed rectangle) designed to provide a basic graphics/multimedia PC platform. For example, the chipset may be a highly-integrated three-chip solution consisting of a graphics and memory controller hub (GMCH; e.g., an Intel® 82810 or 82810-DC100 chip), an input/output (I/O) controller hub (ICH: e.g., and Intel® 82801 chip) and a firmware hub (FWH; e.g., an Intel® 82802 chip).

The GMCH may be interconnected to the system bus, include a memory controller as well as a graphic controller (which in turn may include a three-dimensional (3D) engine, a two-dimensional (2D) engine, and a video engine), and be interconnected to any of a system memory, a display cache (e.g., 4 megabytes (MB)), a display (e.g., a computer monitor) and to a television (TV; via an encoder and a digital video output signal). The ICH may be interconnected to the GMCH, and may then be further interconnected to an of: a Peripheral Component Interconnect (PCI) bus (PCI Local Bus Specification Revision 2.2) which may have any of a plurality of PCI-compliant slots, an Industry Standard Architecture (ISA) bus option and a local area network (LAN) option; a Super I/O arrangement; an audio coder/decoder (Codec) and modem Codec; a plurality of Universal Serial Bus (USB) ports (USB Specification, Revision 1.0); and a plurality of Ultra/66 AT Attachment (ATA) 2 ports (X3T9.2 948D specification; commonly also known as Integrated Drive Electronics (IDE) ports). Finally, the FWH may be interconnected to the ICH.

With the above overview of an example system having been given, a detailed illustrative embodiment of the present invention is disclosed herein. However, computer graphics systems, graphics processing, multiple level of detail maps, image data, sampling and filtering techniques as well as other elements utilized in accordance with the present invention may be embodied in a wide variety of forms, some to which may be quite different from those in the disclosed example embodiment. Consequently, the specific structural and functional details disclosed herein are merely representative.

Figure 2:
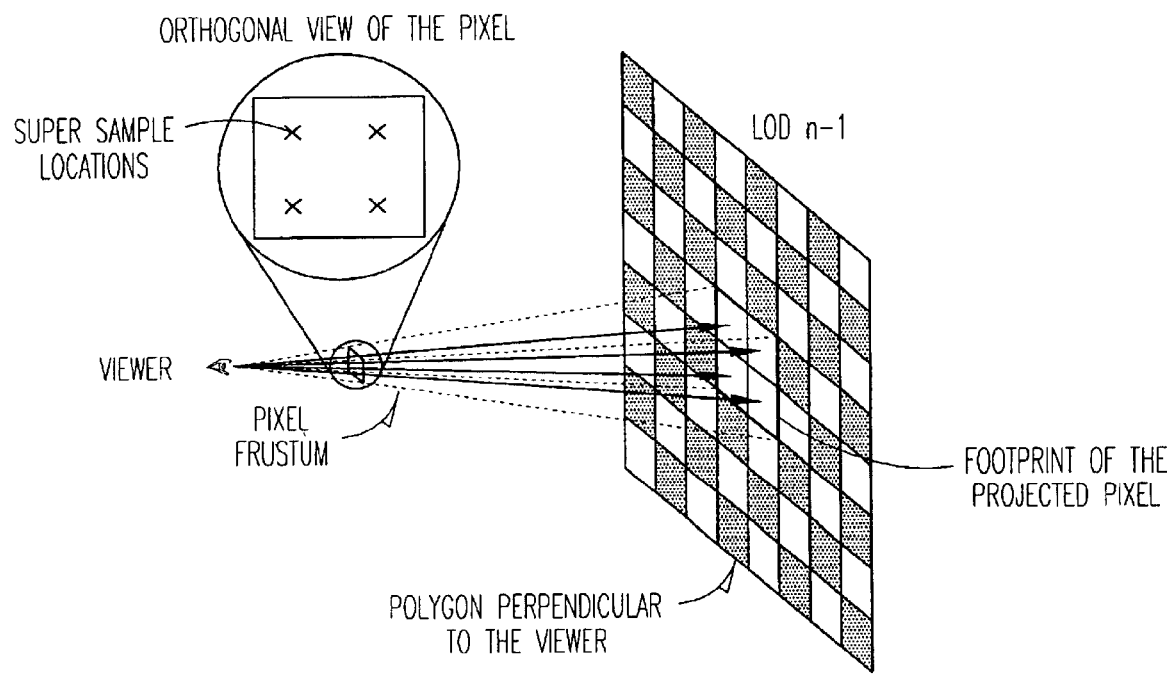
FIG. 2 is an orthogonal view of a pixel with four super-sample locations identified.

Referring to FIG. 2, an eye point is defined at the location of the viewer. A volume is described by projecting four rays from the eye point through the corners of the pixel, and is known as a pixel frustum. Many polygons, which may be associated the multiple objects in a three-dimensional modeling space, may be visible from the eye point through the pixel frustum. FIG. 2 identifies one such polygon, which is oriented perpendicular to the viewer. Furthermore, a checkerboard texture map is applied to the polygon where each of the alternating dark and light squares identifies a single texel in the texture map.

The pixel frustum, which is formed by the projection of the pixel onto the polygon, intersects the polygon to form a footprint on the surface of the polygon (identified by the shaded area). The pixel footprint encloses all of the texels, which are visible from the location of the viewer through the pixel frustum. Potentially, all of the texels within the footprint area contribute to the resultant texture value.

An appropriate LOD may be chosen from a Mip Map such that the necessary filtering to sample the entire footprint is pre-computed and stored in the LOD so as to minimize aliasing. Intuitively, the LOD may be chosen such that the size of the texels is approximately the same size as that of the pixel. Furthermore, the LOD shown in FIG. 2 corresponds to one higher resolution than would normally be selected and is identified as LOD n−1. This results in the texels being one-fourth of their otherwise expected size. Selecting this LOD results in a larger number of texels being enclosed by the pixel footprint. A method of sampling the texels within the footprint results in a more accurate representation of the enclosed texels, particularly in the presence of a non-square pixel footprint.

According to one example embodiment of the present invention, the pixel may be subdivided into four sub-pixels; the centers of which are sampled individually. The location of each super-sample, within the footprint, is determined by projecting through the identified 2D location on the enlarged pixel of FIG. 2. The resulting projection is shown as four arrowed lines that intersect the texture mapped polygon in the center of four adjacent texels. The sampled values are combined such that a final texture value is computed. A bilinear filtering operation may be performed for each super-sample, with the four outputs of the bilinear filter being averaged together. Furthermore, the area of the projected pixel footprint is satisfactorily sampled, due to the fact that the four super-samples provide sufficient coverage of the increased number of texels stored in the n−1 LOD of the Mip Map.

Figure 3:
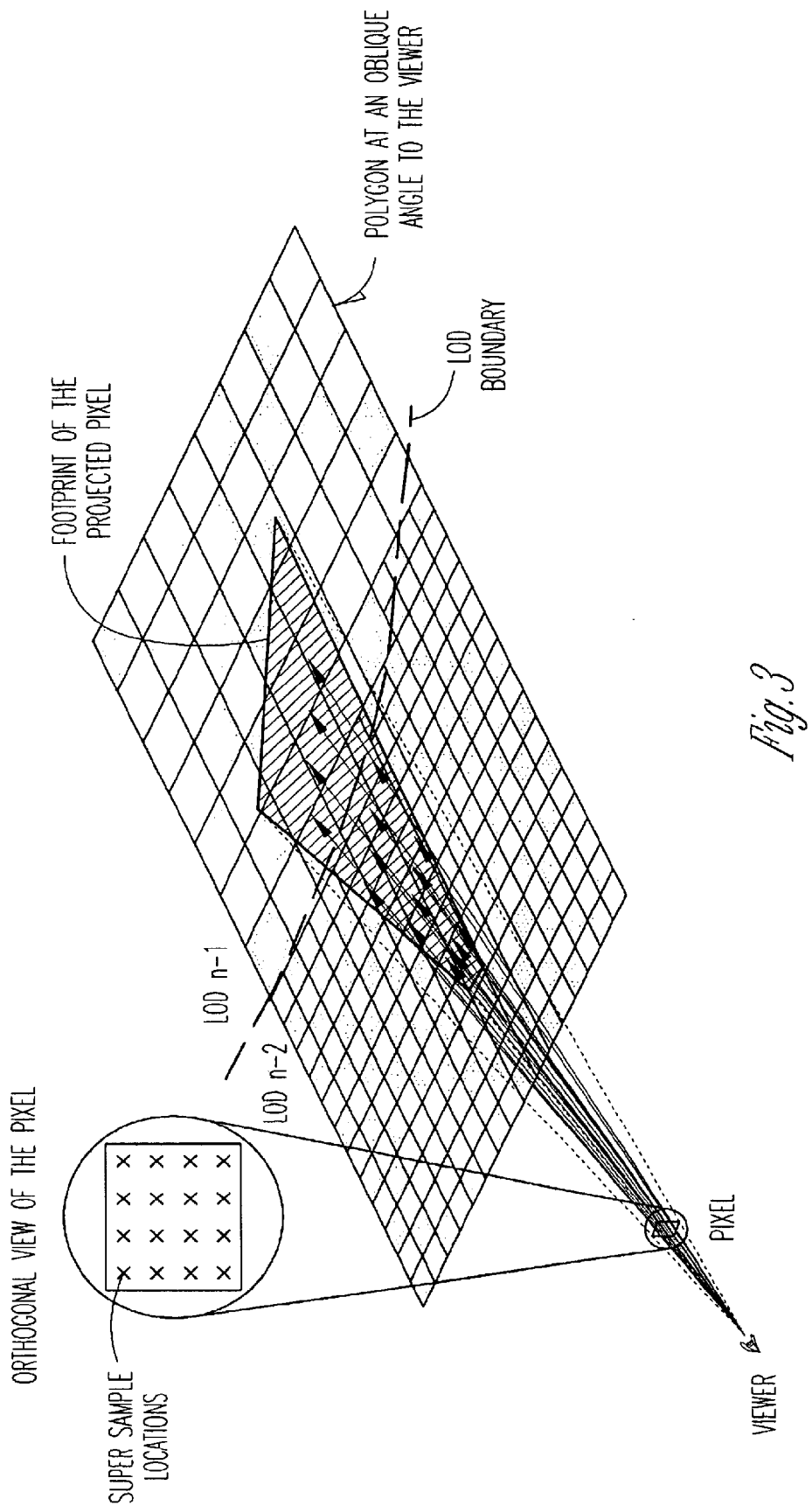
FIG. 3 is a view of a super-sampled footprint, resulting from the projection of a pixel onto a polygon that is at an oblique angle to the viewer.

FIG. 3 illustrates an example in which the polygon in oriented at an oblique angle with respect to the viewer. The irregular shape of the projected pixel footprint results from various factors including the oblique angle involved, the perspective projection of the pixel and non-coplanar locations of the polygon vertices in a 3-dimensional model space. Sixteen super-samples may be projected through the centers of sixteen sub-pixels. The rays emanating from the eye point of the observer pass through the sub-pixels and intersect the polygon within the footprint of the pixel at the points shown by the arrows in FIG. 3.

In other disadvantageous techniques, a ray is projected through the center of the pixel and a path is determined along the length of the footprint. Varying numbers of super-samples are taken along this longitudinal path and are averaged together to produce a resulting texture value.

In the present invention, the entire area of the footprint may be sampled since the pixel is divided into a plurality of sub-pixels. Thus, instead of sampling along an axis, the entire area of the footprint is sampled.

Furthermore, in the other disadvantageous techniques, samples are taken along an axis and the values combined by averaging. That is, the samples close to the axis are given more weight than the samples far away from the axis. In the presence of large perspective projections, the width of the footprint can be dramatically wider at the far end than at the end nearer to the viewer. Thus, texels within the footprint which are sufficiently far away from the longitudinal axis do not contribute to the resulting texture value.

On the other hand, in the technique of the present invention the entire area of the footprint may be sampled without the need for complicated calculations to determine the longitudinal path of the projected pixel footprint as well as the locations of the super-samples along the path. The LOD boundary, identified in FIG. 3, divides the polygon into two regions that are texture mapped using different LOD's from the Mip Map. The LOD for each super-sample is computed and then may be biased toward the higher resolution LOD's by the logarithm (base two) of the number of super-samples in either the horizontal or vertical direction. As illustrated in FIG. 3, if the normally computed LOD is defined to be n for the lower twelve super-samples then the actual sampled LOD in $n-\log_2(4)$ or $n-2$. However, the top four super-samples have a normally computed LOD of $n+1$, which after biasing results in an LOD of $(n+1)-\log_2(4)$ or $n-1$. The texels at LOD $n-1$ are effectively larger than those of LOD $n-2$, and as such provide greater coverage of the projected pixel footprint.

Figure 4:
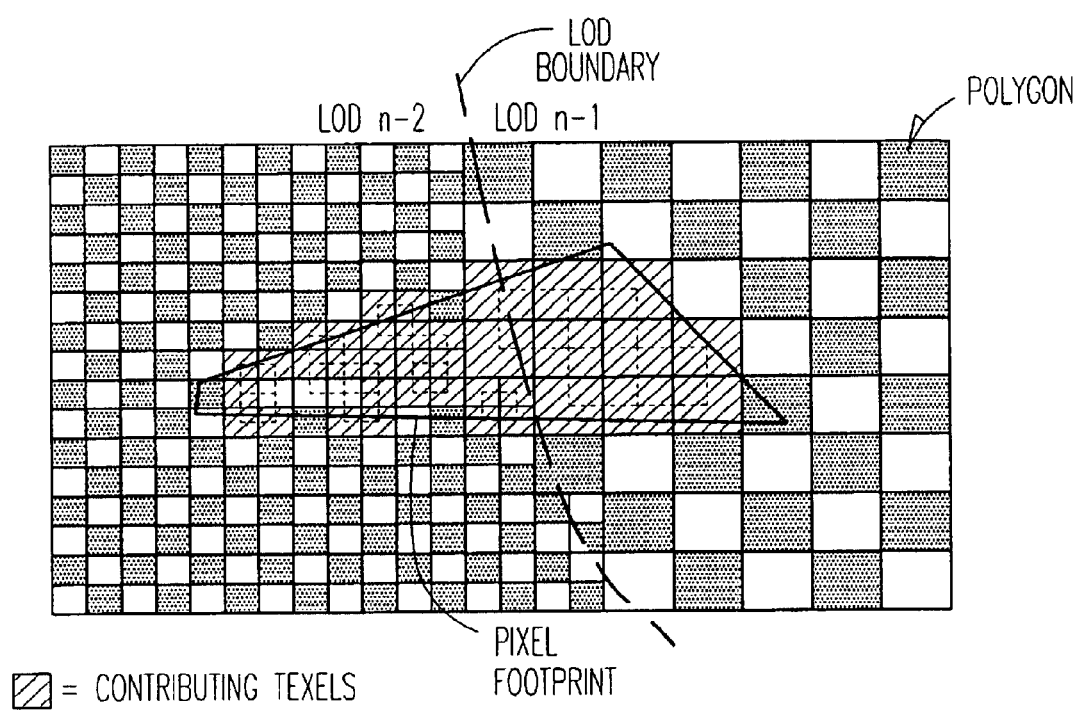
FIG. 4 is an orthogonal view of the projected pixel footprint of FIG. 3, which identifies the contributing texels, resulting from the super-sampling operation.

FIG. 4 is an orthographic view of the footprint on the polygon of FIG. 3 with the contributing texels, from both LOD's. Assuming that the super-samples are bilinear filtering the LOD's, the identified shaded area represents the texels, which contribute to the first level of filtering. The small x's are the projection of the rays from the eye of the observer through the center of the sub-pixels and intersecting the polygon in accordance with the technique of the present invention. Note that the sample points spaced close together share texels. By using a two layer filter concept that is, by first doing simple bilinear filtering at the super-sample locations, for example, each shared texel contributes more than once to the overall average, so that there is a natural weighting that is effected without the complexity of having to compute the actual contributing weight of that texel. Finally, in accordance with this example embodiment, a second level filter averages the output of the bilinearly filtered super-samples to produce a resultant texture value.

Figure 5:
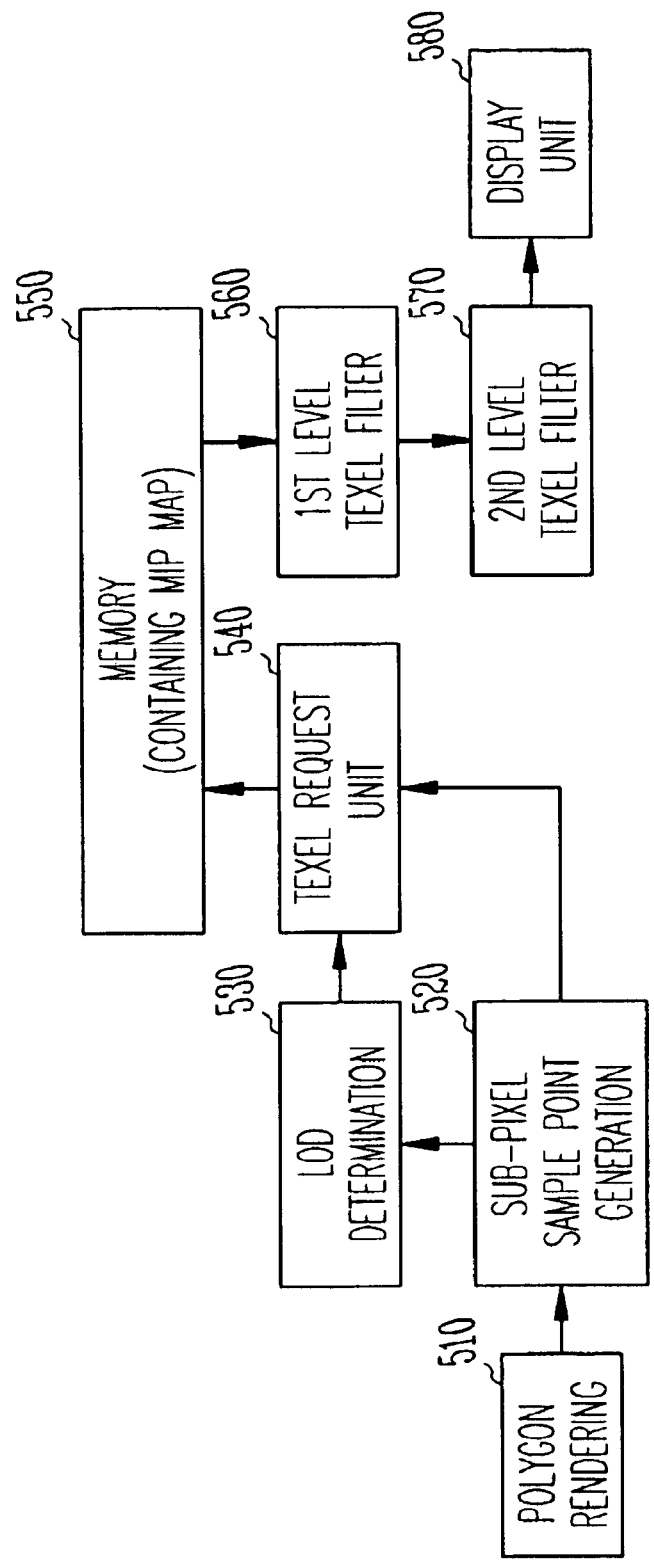
FIG. 5 is a block diagram of a system constructed in accordance with an example embodiment of the present invention.
Figure 6:
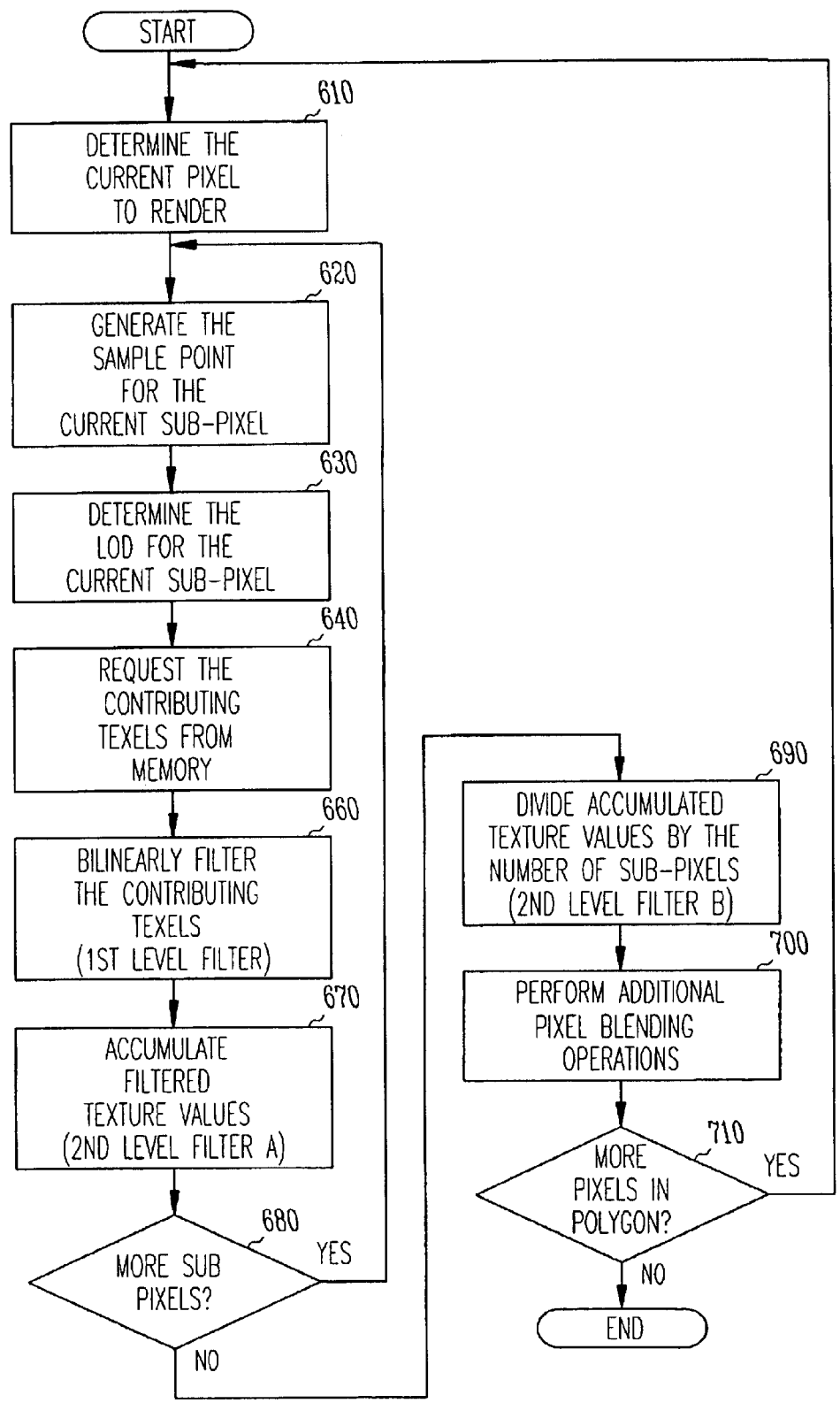
FIG. 6 is a flowchart illustrating the operation of the system of FIG. 5.

FIG. 5 is a block diagram of a system constructed in accordance with an example embodiment of the present invention and FIG. 6 is a flowchart illustrating the operation of the system of FIG. 5.

Firstly, a polygon rendering unit 510 identifies a pixel on the current polygon which is to be texture mapped (see step 610 of FIG. 6).

Then, a sub-pixel sample point is generated by the sub-pixel sample point generation unit as noted in step 620 of FIG. 6.

Then, an LOD (level of detail) determination is made in the LOD determination unit 530 to determine the level of detail of the Mip Map containing texel data stored in the memory 550 (see step 630 of FIG. 6).

After the level of detail determination, the resultant output of the level of detail determination unit 530 is fed to a texel request unit 540 along with the location of the sub-pixel sample point determined by the sub-pixel sample point generation unit 520 and the correct contributing texels are requested by the texel request unit 540 from the memory 550 containing the mip maps of the texel data (see step 640 of FIG. 6).

The contributing texel data stored in the memory 550 and requested by the texel request unit 540 are then filtered in the first level texel filter 560 (see step 660 of FIG. 6). The first level of filtering may include bilinear filtering or trilinear filtering, for example.

The output of the first level texel filter 560 are then forwarded to the second level texel filter 570. As illustrated in FIG. 6, in step 670, the texture levels output from the first level texture filter 560 are accumulated and in step 680, a determination is made as to whether more sub-pixels are to be sampled. If so, the process returns to step 620 to generate the next sample point and if not, the process proceeds to step 690 in which the accumulated texture values may be second level filtered. For example, the accumulated texture values are divided by the number of sub pixels in a simple averaging second level filtering operation.

In any event, the process proceeds to step 700 in which additional pixel blending operations may be performed.

The process then proceeds to step 710 in which a determination is made as to whether more pixels in the polygon need to be texture mapped and if so, the process proceeds to step 610 to process additional pixels and if not, the blended pixel data is inputted to the display unit 580 where it is processed so as to be displayed on a display of a user.

Figure 7A:
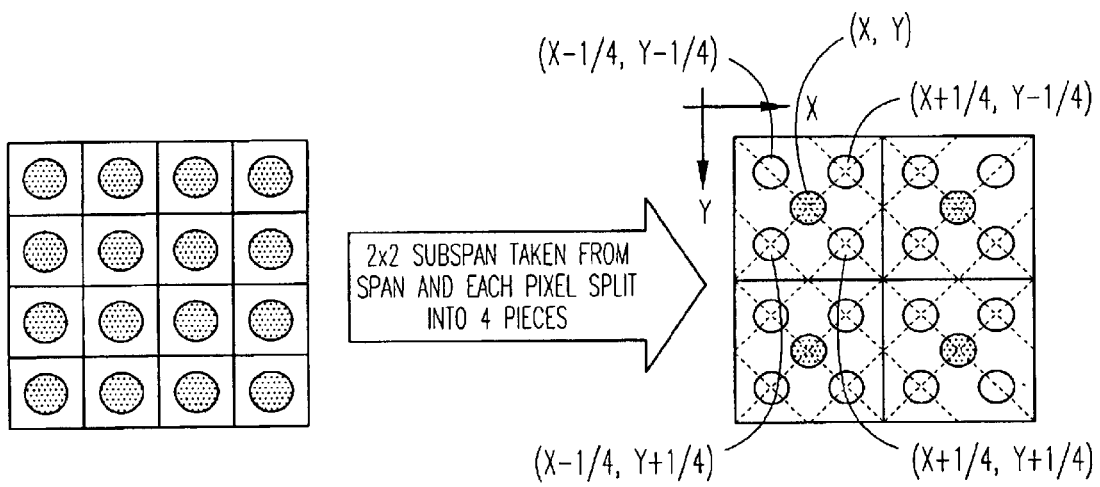
FIG. 7A illustrates a disadvantageous anisotropic filter arrangement in which each pixel is split into four sub-pixels.

FIG. 7A illustrates a disadvantageous anisotropic filter arrangement in which each pixel is split into four sub-pixels. The original pixel is located at point XY and the selected sub-pixels are located at points $X-1/4, Y-1/4, X+1/4, Y-1/4, X-1/4, Y+1/4$, and $X+1/4, Y+1/4$.

The arrangement of FIG. 7A is disadvantageous in that a significant amount of computations are required when these sub-pixel locations are chosen.

Figure 7B:
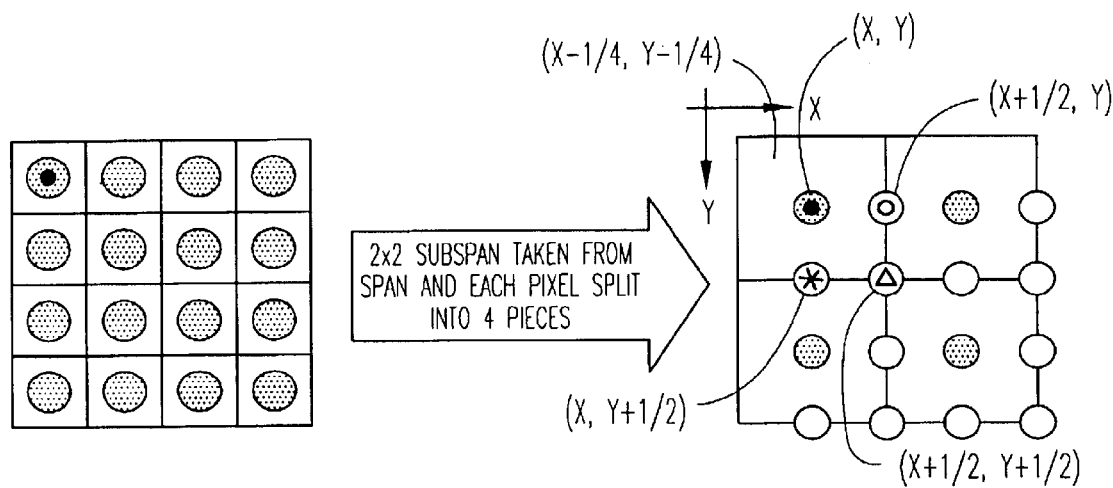
FIG. 7B illustrates the selection of the sub-pixels of an example embodiment of the present invention.

On the other hand, FIG. 7B illustrates the selection of the sub-pixels of an example embodiment of the present invention. The original pixel location X, Y is also chosen as the sub-pixel location X, Y and the additional sub-pixel locations are $X+1/2, Y, X, Y+1/2$, and $X+1/2, Y+1/2$.

The choices of these pixel locations results in a simplified computation as compared with the choices of pixel locations of FIG. 7A.

Figure 7C:
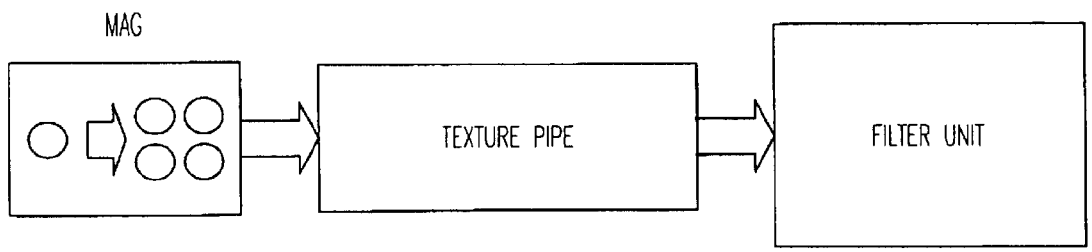
FIG. 7C illustrates the arrangement of operational elements of an example embodiment of the present invention.

FIG. 7C illustrates the arrangement of operational elements of an example embodiment of the present invention. The MAG (mapping address generator) includes the sub-pixel sample point generation unit 520 and LOD (level of detail) determination unit 530 of FIG. 5.

The output of the mapping generator is inputted to the texture pipe whose processed output feeds the filter unit.

Included in the filter unit is the first and second level texel filters 560 and 570 of FIG. 5.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An anisotropic filtering method comprising:

defining pixel elements in two dimensions;

defining an object having three dimensional surfaces in a three dimensional model space;

storing data elements in two dimensions defining a texture map related to the three dimensional surfaces of the object;

dividing a subject pixel element to be texture mapped into a plurality of sub-pixel elements;

texture mapping ones of the sub-pixel elements separately onto corresponding footprints on the texture map to obtain sub-pixel element textures based on the corresponding footprints; and combining at least some of the sub-pixel element textures obtained from the corresponding footprints on the texture map to obtain a texture for the subject pixel element;

wherein the texture map comprises a plurality of Mip Maps of different levels of detail, the Mip Map level of detail is chosen separately for the ones of the pixel or sub-pixel elements, and the Mip Map level of detail is chosen at least in part according to the number of sub-pixel elements that the subject pixel element is divided into.

2. An anisotropic filtering method comprising:

defining pixel elements in two dimensions;

defining an object having three dimensional surfaces in a three dimensional model space;

storing data elements in two dimensions defining a texture map related to the three dimensional surfaces of the object;

dividing a subject pixel element to be texture mapped into a plurality of sub-pixel elements;

texture mapping ones of the sub-pixel elements separately onto corresponding footprints on the texture map with a first level filter to obtain filtered sub-pixel element textures based on the corresponding footprints; and combining at least some of the filtered sub-pixel element textures obtained from the corresponding footprints on the texture map by use of a second level filter to obtain a resulting texture for the subject pixel element.

3. The method of claim 2, wherein the first level filter comprises a bilinear filter.

4. The method of claim 2, wherein the second level filter comprises a filter using averaging.

5. The method of claim 2, wherein each of the ones of the sub-pixel elements is texture mapped using a location on the texture map determined by projecting the sub-pixel element location onto the corresponding footprint on the texture map.

6. The method of claim 2, wherein each of the plurality of sub-pixel elements is texture mapped using respective locations of the texture map determined by projecting ones of the two dimensional sub-pixel element locations of the sub-pixel elements onto the corresponding footprint on the texture map.

7. The method of claim 5, wherein the sub-pixel element location is perspectively projected onto the texture map.

8. The method of claim 6, wherein the sub-pixel element locations are perspectively projected onto the texture map.

9. The method of claim 6, comprising combining all of the sub-pixel element textures of the plurality of sub-pixel elements to obtain a texture for the subject pixel element.

10. The method of claim 2, wherein the texture map comprises a plurality of Mip Maps of different levels of detail.

11. The method of claim 10, wherein the Mip Map level of detail is chosen separately for the ones of the pixel or sub-pixel elements.

12. The method of claim 11, wherein a Mip Map level of detail is chosen at least in part according to the number of sub-pixel elements that the subject pixel element is divided into.

13. An anisotropic filtering method comprising:

defining pixel elements in two dimensions;

defining an object having three dimensional surfaces in a three dimensional model space;

storing data elements in two dimensions defining a texture map related to the three dimensional surfaces of the object;

dividing a subject pixel element to be texture mapped into four sub-pixel elements;

texture mapping the four sub-pixel elements separately onto corresponding footprints on the texture map to obtain four sub-pixel element textures based on the corresponding footprints; and averaging the four sub-pixel element textures obtained from the corresponding footprints on the texture map to obtain a texture for the subject pixel element;

wherein each pixel element is split into four sub-pixel elements having locations in a two dimensional space of: X, Y; X+M/2, Y; X, Y+M/2; and X+M/2, Y+M/2, wherein M is the distance between pixel elements and X, Y is the location of the subject pixel element.

14. An anisotropic filtering apparatus comprising:

a memory and definer for defining pixel elements in two dimensions and defining an object having three dimensional surfaces in a three dimensional model space and storing data elements in two dimensions defining a texture map related to the three dimensional surfaces of the object;

a subdivider for subdividing a subject pixel element to be texture mapped into four sub-pixel elements;

a texture mapper for texture mapping each of the four sub-pixel elements separately onto corresponding footprints on the texture map to obtain four sub-pixel element textures based on the corresponding footprints; and an averager for averaging the four sub-pixel element textures obtained from the corresponding footprints on the texture map to obtain a texture for the subject pixel element;

wherein each pixel element to be anisotropically filtered is subdivided by the subdivider into four sub-pixel elements having locations in a two dimensional space of: X, Y; X+M/2, Y; X, Y+M/2; and X+M/2, Y+M/2, wherein M is the distance between pixels and X, Y is the location of the corresponding pixel element.

15. The method of claim 13, wherein the texture map is one of a plurality of levels of detail of a Mip Map.

16. The apparatus of claim 14, wherein the texture map is one of a plurality of levels of detail of a Mip Map.

17. The method of claim 13, wherein a level of detail in the texture mapping of the sub-pixel elements is chosen to be one level higher in resolution than the level of detail which would be chosen if the pixel was texture mapped without dividing.

18. The apparatus of claim 14, wherein the texture mapper is operable to choose a level of detail in mapping the sub-pixel elements which is one level higher in resolution than the level of detail which would be chosen if the pixel element was texture mapped without subdividing.

19. An anisotropic filtering apparatus comprising:
   a memory and definer for defining pixel elements in two dimensions;
   defining at least one object having three dimensional surfaces in a three dimensional model space and storing data elements in two dimensions defining a texture map related to the three dimensional surfaces of the at least one object;
   a subdivider for subdividing each pixel element to be texture mapped with anisotropic filtering into a plurality of sub-pixel elements;
   a texture mapper including a first level filter for texture mapping each of the sub-pixel elements separately onto corresponding footprints on the texture map with the first level filter to obtain filtered sub-pixel element textures based on the corresponding footprints; and
   a combiner including a second level filter for combining the output from all of the sub-pixel element first level filters obtained from the corresponding footprints on the texture map by use of the second level filter to obtain a resulting texture for the respective pixel element.

20. The apparatus of claim 19, wherein the first level filter comprises a bilinear filter.

21. The apparatus of claim 19, wherein the second level filter comprises a filter using averaging.

22. The apparatus of claim 19, wherein the texture mapper maps each sub-pixel element using a location on the texture map determined by projecting the sub-pixel element location onto the corresponding footprint on the texture map.

23. The apparatus of claim 19, wherein the texture mapper maps the plurality of sub-pixel elements using respective locations on the texture map determined by projecting the two dimensional locations of the sub-pixel elements onto the corresponding footprint on the texture map.

24. An integrated circuit (IC) chip arrangement comprising:
   an anisotropic filter including:
   a definer to define pixel elements in two dimensions, to define an object having three dimensional surfaces in a three dimensional model space, and to define data elements in two dimensions for a texture map related to the three dimensional surfaces of the object;
   a subdivider to subdivide a subject pixel element to be texture mapped into a plurality of sub-pixel elements;
   a texture mapper to texture map ones of the sub-pixel element separately onto corresponding footprints on the texture map to obtain sub-pixel element textures based on the corresponding footprints; and
   a combiner to combine all of the sub-pixel element textures obtained from the corresponding footprints on the texture map to obtain a texture for the subject pixel element;
   wherein each of the plurality of sub-pixel elements are texture mapped using respective locations on the texture map determined by projecting ones of two dimensional sub-pixel element locations of the sub-pixel elements onto a footprint on the texture map and each pixel element is split into four sub-pixel elements having locations in a two dimensional space of: X, Y; X+M/2, Y; X, Y+M/2; and X+M/2, Y+M/2, wherein M is the distance between pixel elements and X, Y is the location of the subject pixel element.

25. A graphics controller comprising:
   an anisotropic filter including:
   a definer to define pixel elements in two dimensions, to define an object having three dimensional surfaces in a three dimensional model space, and to define data elements in two dimensions for a texture map related to the three dimensional surfaces of the object;
   a subdivider to subdivide a subject pixel element to be texture mapped into a plurality of sub-pixel elements;
   a texture mapper to texture map ones of the sub-pixel elements separately onto corresponding footprints on the texture map to obtain sub-pixel element textures based on the corresponding footprints; and
   a combiner to combine all of the sub-pixel element textures obtained from the corresponding footprints on the texture map to obtain a texture for the subject pixel element;
   wherein each of the plurality of sub-pixel elements are texture mapped using respective locations on the texture map determined by projecting ones of two dimensional sub-pixel element locations of the sub-pixel elements onto the corresponding footprint on the texture map and each pixel element is split into four sub-pixel elements having locations in a two dimensional space of: X Y; X+M/2, Y; X, Y+M/2; and X+M/2, Y+M/2, wherein M is the distance between pixel elements and X, Y is the location of the subject pixel element.

26. A system comprising:
   a power supply;
   at least one display connector; and
   an anisotropic filter including:
   a definer to define pixel elements in two dimensions, to define an object having three dimensional surfaces in a three dimensional model space, and to define data elements in two dimensions for a texture map related to the three dimensional surfaces of the object;
   a subdivider to subdivide a subject pixel element to be texture mapped into a plurality of sub-pixel elements;
   a texture mapper to texture map ones of the sub-pixel elements separately onto corresponding footprints on the texture map to obtain sub-pixel element textures based on the corresponding footprints; and
   a combiner to combine all of the sub-pixel element textures obtained from the corresponding footprints on the texture map to obtain a texture for the subject pixel element;
   wherein each of the plurality of sub-pixel elements are texture mapped using respective locations on the texture map determined by projecting ones of two dimensional sub-pixel element locations of the sub-pixel elements onto the corresponding footprint on the texture map and each pixel element is split into four sub-pixel elements having locations in a two dimensional space of: X, Y; X+M/2 Y; X, Y+M/2; and X+M/2, Y+M/2, wherein M is the distance between pixel elements and X, Y is the location of the subject pixel element.

* * * * *